(12) United States Patent
Reyes

(10) Patent No.: US 6,661,014 B2
(45) Date of Patent: Dec. 9, 2003

(54) METHODS AND APPARATUS FOR OXYGEN IMPLANTATION

(75) Inventor: Jaime M. Reyes, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 10/095,678

(22) Filed: Mar. 12, 2002

(65) Prior Publication Data

US 2002/0130270 A1 Sep. 19, 2002

Related U.S. Application Data

(60) Provisional application No. 60/275,425, filed on Mar. 13, 2001.

(51) Int. Cl.[7] .............................................. H01J 27/00
(52) U.S. Cl. .............................. 250/423 R; 250/423 R; 250/423 F; 250/427; 250/492.3; 250/424; 250/425; 313/360.1; 313/363.1; 313/362.1; 313/230; 313/336; 313/359.1; 315/111.81
(58) Field of Search ...................... 250/423 R, 423 F, 250/427, 492.3, 424, 425; 313/360.1, 363.1, 362.1, 230, 336, 359.1; 315/111.81

(56) References Cited

U.S. PATENT DOCUMENTS

| | | | |
|---|---|---|---|
| 4,488,045 A | * 12/1984 | Anazawa et al. | ........ 250/423 R |
| 4,714,834 A | * 12/1987 | Shubaly | ....................... 250/427 |
| 4,994,711 A | * 2/1991 | Matossian | ................ 313/362.1 |
| 5,780,862 A | * 7/1998 | Siess | ....................... 250/492.3 |
| 5,808,416 A | 9/1998 | Armini | |

* cited by examiner

*Primary Examiner*—John R. Lee
*Assistant Examiner*—Zia R. Hashmi

(57) ABSTRACT

An oxygen ion containing plasma is generated using a hot filament ion source. The oxygen ions in the plasma come from an oxide source (e.g., a metal oxide) which has a lower free energy of formation than that of the filament metal oxide (e.g., $WO_3$) at the operating temperatures of the ion source. Consequently, oxidation of the filament and other metal components of the arc chamber is limited, or even prevented. Thus, the invention can advantageously lead to longer filament lives as compared to certain conventional processes that generate oxygen plasmas using hot filament sources.

28 Claims, 4 Drawing Sheets

METHODS AND APPARATUS FOR OXYGEN IMPLANTATION

CROSS REFERENCE TO RELATED APPLICATIONS

This application claims priority to U.S. provisional patent application Ser. No. 60/275,425, filed Mar. 13, 2001, and entitled "Oxygen Implant From Solid Source", the disclosure of which is incorporated herein by reference in its entirety.

FIELD OF THE INVENTION

The invention relates generally to ion implantation and, more particularly, to an apparatus and method for generating oxygen ions.

BACKGROUND OF THE INVENTION

Ion implantation is a conventional technique for introducing dopants into semiconductor materials. A desired dopant may be ionized to form a plasma in an ion source. The ions are accelerated from the source to form an ion beam of selected energy which is directed at the surface of a wafer. The ions in the beam penetrate into the bulk semiconductor material to form an implanted region.

In some processes, oxygen is implanted into a semiconductor material. Some conventional implantation processes have generated oxygen plasmas by introducing oxygen gas into an arc chamber of the ion source using a gaseous source feed. If the ion source uses an RF or microwave source to generate the plasma, the presence of oxygen gas in the arc chamber may not be problematic. However, if the ion source uses a hot filament formed of an oxidizable metal (e.g., tungsten) to generate the plasma, the presence of oxygen gas in the arc chamber can cause oxidation of the hot filament. This oxidation can significantly reduce filament life and may result in filament metal deposits on the insulators, both inside and outside the arc chamber.

One approach to address the oxidation problem has been to use a less oxidizing source gas, such as $CO_2$ or $CO$. However, some oxidation of the filament still may occur and carbon deposits may form inside the ion source. Another approach has been to use a very dilute mixture of an oxygen-containing gas (e.g., $NO$, $N_2O$, and the like) and an inert gas, such as Argon. This approach, however, is generally effective only for low ion dose requirements because of the low oxygen concentration.

It would be desirable to have an ion implantation method and apparatus which can generate an oxygen ion beam from a hot filament source, while limiting oxidation of the filament.

SUMMARY OF THE INVENTION

According to the methods and apparatus of the invention, an oxygen ion containing plasma is generated using a hot filament ion source. The oxygen ions in the plasma come from an oxide source (e.g., a metal oxide) which has a lower free energy of formation than that of the filament metal oxide (e.g., $WO_3$) at the operating temperatures of the ion source. Consequently, oxidation of the filament and other metal components of the arc chamber is limited, or even prevented. Thus, the methods and apparatus of the invention can advantageously lead to longer filament lives as compared to certain conventional processes that generate oxygen plasmas using hot filament sources.

In one aspect, the invention provides an ion source comprising a chamber, a metal filament housed within the chamber, and an oxygen source component housed within the chamber. The oxygen source component comprises an oxide compound which has a lower free energy of formation than the oxide of the filament metal over the operating temperature range of the ion source.

In another aspect, the invention provides an ion source. The ion source comprises a chamber, a metal filament housed within the chamber, and an oxygen source component housed within the chamber. The oxygen source component comprises a metal oxide of the group consisting of $Ga_2O_3$, $B_2O_3$, $SiO_2$, $Al_2O_3$, $TiO_2$, $ZrO_2$, and $MgO$. The ion source further comprises a source gas supply connected to the chamber.

In another aspect, the invention provides a repeller unit for an arc chamber of an ion source. The repeller unit comprises a conductor plate and a connector connecting the conductor plate to a voltage source. The repeller unit further comprises an ion source component mounted on the conductor plate and exposed to the interior of the arc chamber when the repeller unit is mounted therein. The ion source component comprises a solid oxide compound which is a member of the group consisting of $Ga_2O_3$, $B_2O_3$, $SiO_2$, $Al_2O_3$, $TiO_2$, $ZrO_2$, and $MgO$.

In another aspect, the invention provides a method of generating oxygen ions in an arc chamber of an ion source having a metal filament therein. The method comprises the step of providing a solid oxygen source within the arc chamber. The solid oxygen source comprises an oxide compound which has a lower free energy of formation than the oxide of the filament metal over the operating temperature range of the arc chamber. The method further comprises the steps of feeding a source gas into the chamber, passing current through the filament, and causing electrons to be emitted from the filament. The electrons collide with source gas molecules to create fluoride ions that chemically interact with the solid oxygen source to form oxygen ions.

In another aspect, the invention provides a method of generating an ion beam of a desired species, selected from the group consisting of Al, Ga, B, Si, Ti, Zr, and Mg ions, in an ion implanter apparatus comprising an ion source including an arc chamber having an electron emitting filament therein of an oxidizable metal. The method comprises the steps of providing a solid oxide of the desired species in the arc chamber; feeding a source gas into the chamber; generating an arc in the arc chamber by thermionic electron emission from the filament; extracting an ion beam comprising ions of the desired species from the arc chamber; and separating the desired species ions from other components of the ion beam to form the ion beam of the desired species.

Other aspects, features and advantages will become apparent from the following detailed description and drawings when considered in conjunction with the claims.

DETAILED DESCRIPTION

The invention is intended to enable the implantation of oxygen ions using a hot filament ion source (e.g., a Bernas source) without creating an oxidizing atmosphere inside the source. This limits oxidation of metal components inside the arc chamber and, in particular, the hot filament. As described further below, filament oxidation is limited by using an oxygen source formed of an oxide compound which has a lower free energy of formation than the oxide of the filament metal (e.g., $WO_3$). In some embodiments of the invention, the oxide compound is formed of a solid metal oxide and may be mounted within an arc chamber of the ion source. Advantageously, the invention enables production of an $O^+$ ion beam for ion implantation using hot filament ion sources, while limiting detrimental effects on the filament life.

Figure 1:
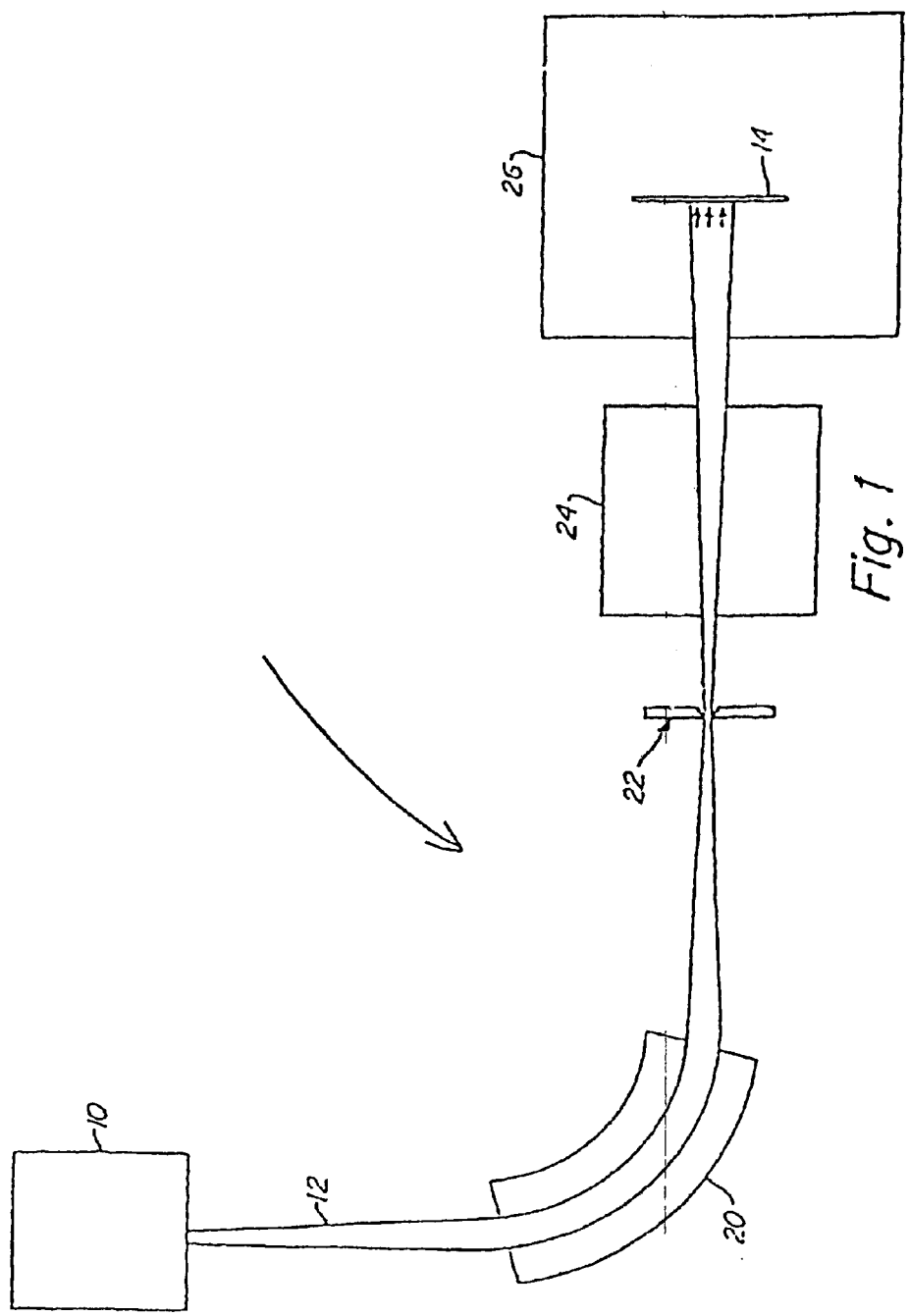
FIG. 1 is a simplified schematic block diagram of an ion implanter.

A schematic block diagram of a typical ion implantation system 1 is shown in FIG. 1. An ion source 10 generates an ion beam 12 which is directed along a beam path toward a target such as a semiconductor wafer 14. The ion source 10 includes an arc chamber in which an ionized plasma is generated by thermionic electron emission from a filament, as described further below. The ion beam 12 is deflected and focused by a mass analyzing magnet 20. Downstream of the mass analyzing magnet 20, the ion beam may be focused in the plane of a mass resolving slit assembly 22. A variety of slit assembly configurations are known, including the rotating cylinder configuration of U.S. Pat. No. 5,629,528 and the prior slit assembly configurations described in the background thereof. Slit assembly 22 may be fashioned according to any such known configuration.

The ion beam 12 is accelerated to a desired energy by an accelerator 24 and impinges on wafer 14 located within an end station 26. The entire region between the ion source 10 and the wafer is evacuated during ion implantation.

The ion beam 12 may be distributed over the surface of wafer 14 by mechanically scanning the wafer with respect to the beam, by scanning the ion beam with respect to the wafer or by a combination of these techniques. The wafers may be, for example, mounted on a rotating disk during ion implantation. End station 26 may include a system for automatically loading semiconductor wafers into one or more wafer positions for implantation and for removing the wafers from the wafer chamber after ion implantation. The ion implantation system may include other components, not shown but known to the skilled person in the art, such as a dose measuring system, an electron flood system, and a tilt angle monitoring system, among others.

Figure 2:
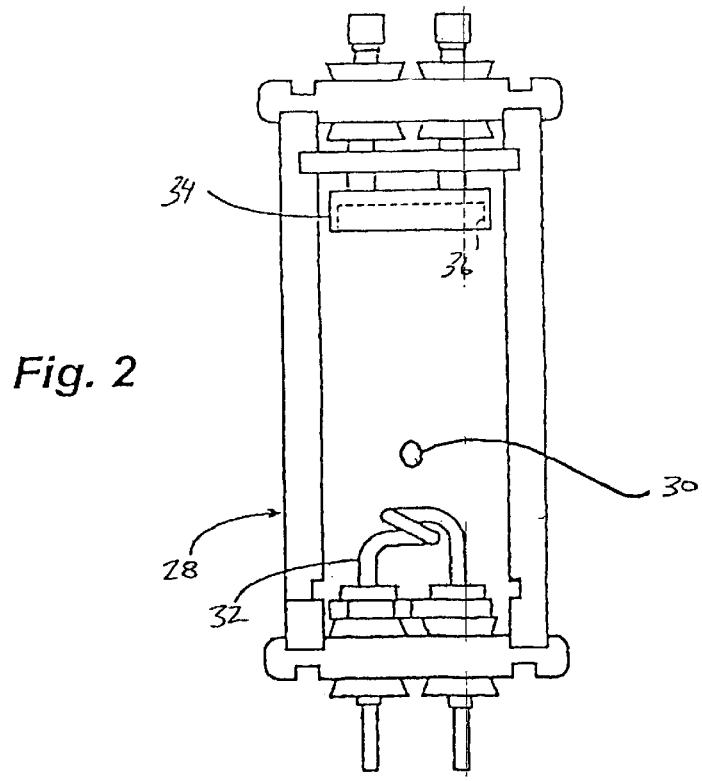
FIG. 2 is a schematic top sectional view of an ion source chamber for an ion implanter employing a repeller according to an embodiment of the invention.

Referring to FIG. 2, a simplified schematic of an arc chamber 28 of an ion source is shown according to one embodiment of the invention in which an ionized oxygen plasma is generated and from which an oxygen ion beam may be extracted. Arc chamber 28 is maintained under vacuum. A source gas, which typically includes no oxygen or a very small percentage of oxygen (e.g., less than 1% oxygen by weight), is fed into the chamber through a port 30. Current is passed through filament 32, causing it to heat up and to thermionically emit electrons from its surface. Filament 32 may be any type of hot filament used in the art. In some embodiments, a tungsten filament is used. In other embodiments, a tantalum filament is used.

A voltage, for example between about 30 and about 150 volts, may be applied between the filament 32 and a positive electrode (e.g., chamber 28). The electrons emitted from the filament collide with source gas molecules to generate positive ions. In some embodiments, a magnetic field may be applied perpendicular to the electric field within the chamber to increase the electron path and, thus, increase the probability of collisions between electrons and ion source gas molecules within the chamber.

An oxygen source component 36, which may be in the form of a plate, is mounted to a repeller unit 34 so that it is exposed to the interior of the arc chamber. The source gas ions in the arc discharge chemically interact with the oxygen source component to form oxygen ions. The oxygen ions are introduced into the plasma within the chamber. The chemical interaction may result in erosion of the oxygen source component. Thus, the oxygen source component plate may require periodic replacement.

The oxygen ions in the plasma may be extracted from the chamber to form a beam. It should be understood that the beam also may include other types of ions, such as source gas ions. As the beam passes downstream through the ion implantation system, conventional techniques may be used to eliminate unwanted ionic species from the beam and, thus, select a specific ionic species for implantation. Further downstream the ion beam, may be monitored for "set up current," accelerated or decelerated as desired, scanned and directed at the wafer.

Figure 3:
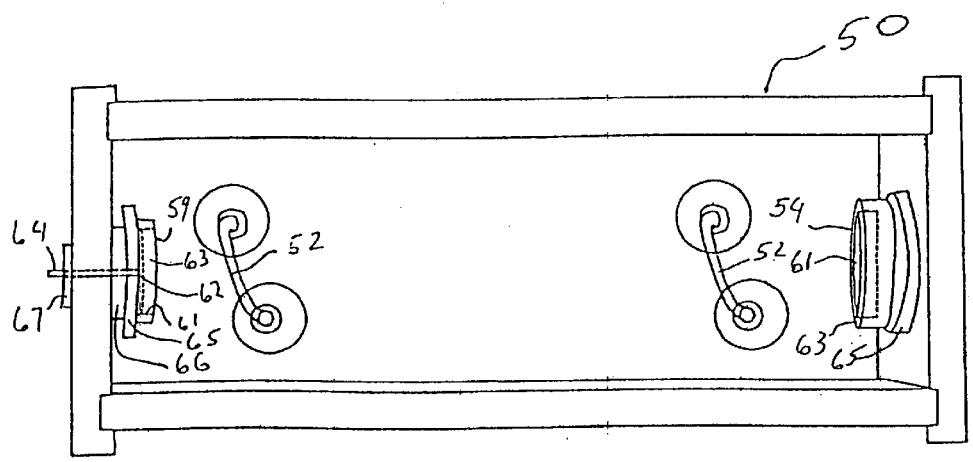
FIG. 3 is a perspective side sectional view of an ion source chamber according to another embodiment of the present invention.

FIG. 3, shown in a slight perspective view, depicts an arc chamber 50 according to another embodiment of the invention. In this embodiment, arc chamber 50 includes two filaments 52 and two repeller units 54. Each repeller unit 54 includes an oxygen source component 61, which may be in the form of a plate, that is held on a metallic repeller conductor 62 by a retaining ring 63. The repeller conductor 62 is disk-shaped with a rearwardly extending shaft 64 which extends to the outside of the chamber 50. Other components of the repeller units 54 include inner insulator 65, repeller shield 66, and outer insulator 67, all of conventional design.

Figure 4:
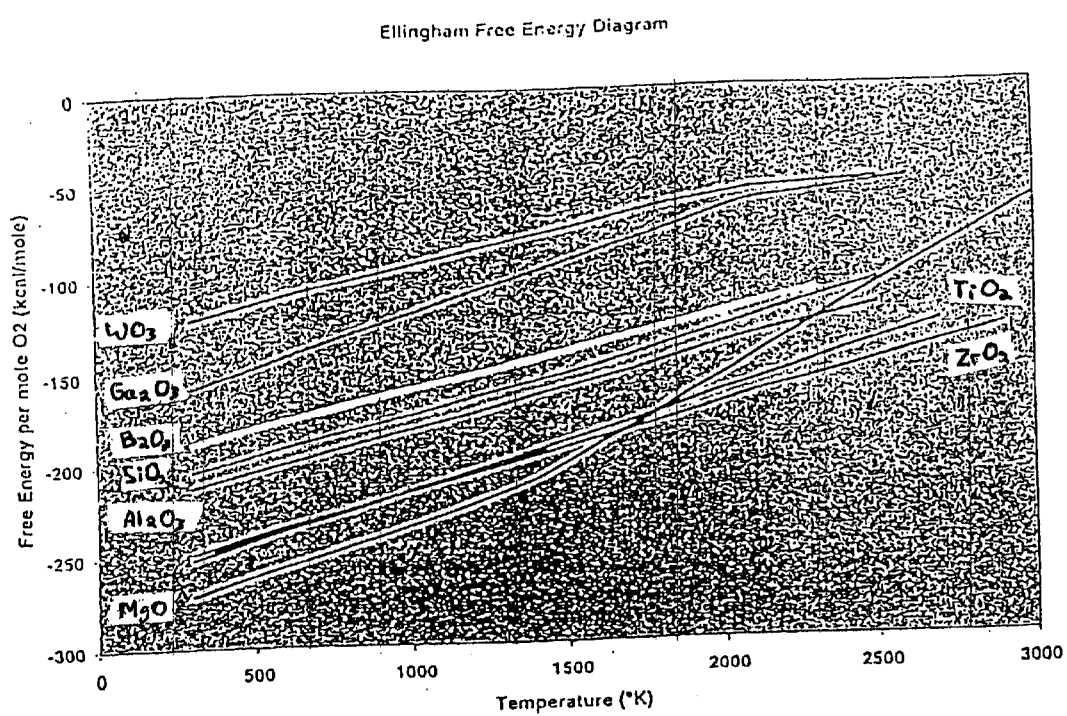
FIG. 4 is a graph showing the free energy of formation versus temperature for $WO_3$ and a number of other metal oxides which can be used as the oxide source component according to embodiments of the invention.

Oxygen source components 36 and 61 in FIGS. 2 and 3, respectively, function as the oxygen ion sources according to the invention. As shown in the illustrative embodiments, the oxygen source component is formed of a solid metal oxide. Suitable metal oxides include those that have a lower free energy of formation than the oxide of the filament metal (e.g., $WO_3$) over the operating temperature of the ion source (e.g., between about 290 K to about 2500 K). Examples of suitable metal oxides include $Ga_2O_3$, $B_2O_3$, $SiO_2$, $Al_2O_3$, $TiO_2$, $ZrO_2$, and MgO. In some cases, $Al_2O_3$ is particularly preferred for the oxygen source component. FIG. 4 is a plot of the free energy of formation versus temperature showing that $WO_3$ has a higher free energy of formation over the ion source operating temperature than $Ga_2O_3$, $B_2O_3$, $SiO_2$, $Al_2O_3$, $TiO_2$, $ZrO_2$, and MgO. It should be understood, however, that other oxide materials which have lower free energies than suitable hot filament elements (e.g., $WO_3$) within the operating temperature of the ion source may also be used.

It should be understood that, in some embodiments, the plasma generated using metal oxides as the oxygen source component may also include substantial quantities of ions of the metal or metalloid used to form the oxide. If desired, these ions may be eliminated from the ion beam using conventional techniques as described above.

In some embodiments of the present invention, a fluoride gas is used as the source gas. Suitable fluoride gases may be, for example, $BF_3$, $SiF_4$, $F_2$, or HF, or mixtures thereof. In some embodiments, $BF_3$ or $SiF_4$ may be preferred. Conditions for generating plasmas in an arc chamber using such gases are well known. It should be understood that the source gas includes no oxygen, or a very small percentage of oxygen, so as to limit filament oxidation.

The invention may be implemented in any filament electron emitter arc chamber including those employed in ion implanters such as the VIISion, VIISta and EHPi series ion implanters manufactured by Varian Semiconductor Equipment Associates, Inc., Gloucester Mass., USA.

The present invention will be further illustrated by the following example, which is intended to be illustrative in nature and is not to be considered as limiting the scope of the invention.

EXAMPLE

This example illustrates the generation of an ion beam that includes oxygen ions using the methods and apparatus of the present invention.

A VIISion Ion Implanter from Varian Semiconductor Equipment Associates, Inc. was modified to include a repeller unit and an arc chamber similar to those shown schematically in FIG. 3. An $SiF_4$ source gas was fed into the arc chamber at a flow rate of 3 sccm. An $Al_2O_3$ repeller plate was used as the oxygen source component. An arc voltage of 80 V was used to generate a plasma containing oxygen ions and aluminum ions from the $Al_2O_3$ repeller plate. An ion beam was extracted from the arc chamber.

Figure 5:
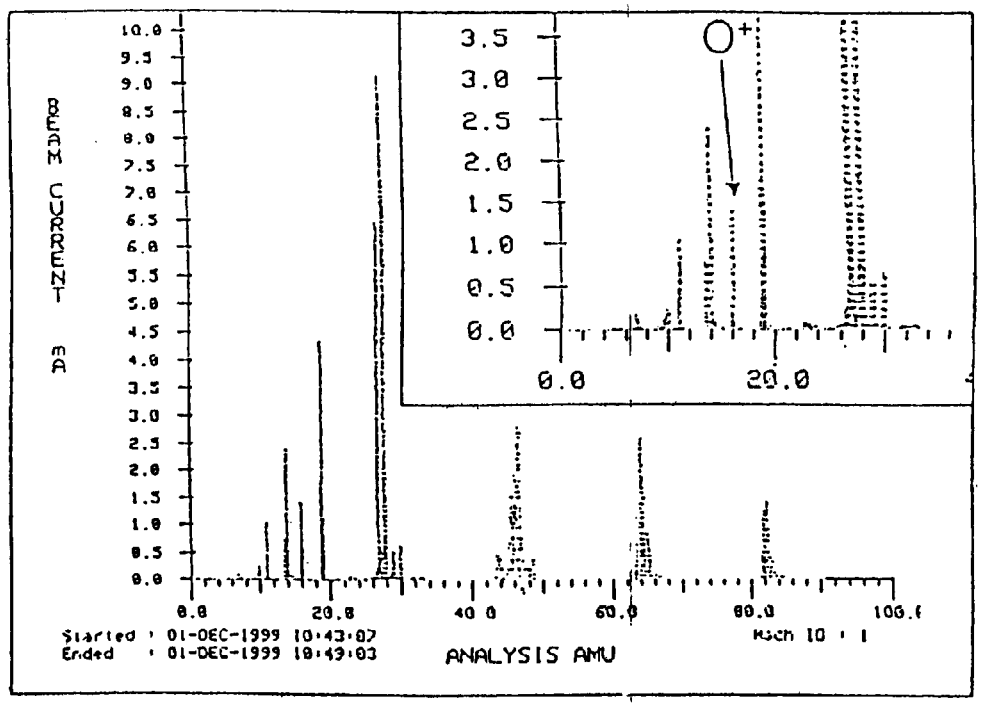
FIG. 5 is a plot of a setup cup beam spectrum obtained from an arc $SiF_4$ arc discharge using an $Al_2O_3$ repeller disk in accordance with an example of the invention.

FIG. 5 shows the beam current spectrum of an ion beam, measured at the setup cup of the implanter. The inset portion of FIG. 5 is an enlargement of the region of the spectrum between 0 and 38 AMU. The spectrum in FIG. 5 shows that approximately 1.5 mA of $O^+$ beam current may be obtained. As also shown in FIG. 5, the beam also includes aluminum ions as a result of the use of an $Al_2O_3$ source component. It should be understood that higher oxygen beam currents may be obtainable with optimization and that the aluminum ions can be eliminated from the beam using known techniques, if desired.

The above description is intended to be illustrative and not exhaustive. The description will suggest many variations and alternatives to one of ordinary skill in this art. All these alternatives and variations are intended to be included within the scope of the attached claims. Those familiar with the art may recognize other equivalents to be specific embodiments described herein which equivalents are also intended to be encompassed by the claims attached hereto. Further, the particular features presented in the independent claims below can be combined with each other in other manners within the scope of the invention such that the invention should be recognized as also specifically directed to other embodiments having any other possible combination of the features of the dependent claims.

What is claimed is:

1. An ion source comprising:
   a chamber;
   a metal filament housed within the chamber; and
   an oxygen source component housed within the chamber, the oxygen source component comprising an oxide compound which has a lower free energy of formation than the oxide of the filament metal over the operating temperature range of the ion source for enabling the implantation of oxygen ions while limiting oxidation of the filament metal.

2. An ion source as in claim 1, wherein the oxygen source component is a plate.

3. An ion source as in claim 1, wherein the ion source further comprises a repeller unit and the oxygen source component is mounted to the repeller unit.

4. An ion source as in claim 7, wherein the metal filament comprises tungsten.

5. An ion source as in claim 1, wherein the metal filament comprises tantalum.

6. An ion source as in claim 1, wherein the oxide compoud is a metal oxide of the group consisting of $Ga_2O_3$, $B_2O_3$, $SiO_2$, $Al_2O_3$, $TiO_2$, $ZrO_2$ and MgO.

7. An ion source as in claim 6, wherein the oxide compound is $Al_2O_3$.

8. An ion source as in claim 1, wherein the oxide compound has a lower free energy of formation than the oxide of the metal filament element over the temperature range of between about 290 K to about 2500 K.

9. An ion source as in claim 1, further comprising a source gas supply connected to the chamber.

10. An ion source as in claim 9, wherein the source gas supply is configured to deliver a gas including less than 1% by weight oxygen.

11. An ion source as in claim 9, wherein the source gas supply is configured to deliver a fluoride source gas.

12. An ion source as in claim 10, wherein the fluoride source gas is selected from the group consisting of $BF_3$, $SiF_4$, $F_2$, and HF.

13. An ion source as in claim 1, further comprising a repeller unit and the oxygen source component is a plate of the oxide compound mounted to the repeller unit.

14. An ion implantation system comprising an ion source as in claim 1.

15. An ion source comprising:
   a chamber;
   a metal filament housed within the chamber;
   an oxygen source component housed within the chamber, the oxygen source component comprising a metal oxide of the group consisting of $Ga_2O_3$, $B_2O_3$, $SiO_2$, $Al_2O_3$, $TiO_2$, and MgO for enabling the implantation of ions while limiting oxidation of the metal filament; and
   a source gas supply connected to the chamber.

16. An ion source as in claim 15, wherein the source gas supply is configured to deliver a fluoride source gas.

17. A repeller unit for an arc chamber of an ion source, the repeller unit comprising:
   a conductor plate;
   a connector connecting the conductor plate to a voltage source; and
   an ion source component mounted on the conductor plate and exposed to the interior of the arc chamber when the repeller unit is mounted therein, the ion source component comprising a solid oxide compound which is a member of the group consisting of $Ga_2O_3$, $B_2O_3 SiO_2$, $Al_2O_3$, $TiO_2$, $ZrO_2$, and MgO for enabling the implantation of ions while limiting oxidation of a filament metal of the ion source.

18. A repeller unit as in claim 17, wherein the ion source component is a plate of said solid oxide compound which coextensively covers the conductor plate.

19. A repeller unit as in claim 17, further comprising an insulator disposed between the conductor plate and the arc chamber when the repeller unit is mounted to the arc chamber.

20. A method of generating oxygen ions in an arc chamber of an ion source having a metal filament therein, the method comprising:
   providing a solid oxygen source within the arc chamber, the solid oxygen source comprising an oxide compound which has a lower free energy of formation than the oxide of the filament metal over the operating temperature range of the arc chamber for limiting oxidation of the filament metal;

feeding a source gas into the chamber;

passing current through the filament; and causing electrons to be emitted from the filament, the electrons colliding with source gas molecules to create source gas ions that chemically interact with the solid oxygen source to form oxygen ions.

21. A method as in claim 20, further comprising applying a voltage between the filament and a positive electrode.

22. A method as in claim 20, wherein the solid oxygen source oxide compound is a metal oxide of the group consisting of $Ga_2O_3$, $B_2O_3$, $SiO_2$, $Al_2O_3$, $TiO_2$, $ZrO_2$, and MgO.

23. A method as in claim 20, wherein the source gas is a fluoride gas.

24. A method as in claim 23, wherein the fluoride gas is selected from the group consisting of $BF_3$, $SiF_4$, $F_2$ and HF.

25. A method as in claim 20, further comprising extracting an ion beam including the oxygen ions from the arc chamber.

26. A method as in claim 25, further comprising separating other components of the ion beam from the oxygen ions to form an oxygen ion beam.

27. A method as in claim 26, further comprising implanting the oxygen ions from the oxygen ion beam in a semiconductor wafer.

28. A method of generating an ion beam of a desired species, selected from the group consisting of Al, Ga, B, Si, Ti, Zr, and Mg ions, in an ion implanter apparatus comprising an ion source including an arc chamber having an electron emitting filament therein of an oxidizable metal, the method comprising providing a solid oxide of the desired species in the arc chamber, feeding a source gas into the chamber, generating an arc in the arc chamber by thermionic electron emission from the filament for enabling the implantation of ions while limiting oxidation of the filament, extracting an ion beam comprising ions of the desired species from said arc chamber, and separating the desired species ions from other components of the ion beam to form said ion beam of said desired species.

* * * * *